US012748137B2

(12) United States Patent
Shor et al.

(10) Patent No.: US 12,748,137 B2
(45) Date of Patent: Sep. 29, 2026

(54) METHOD FOR MEASURING VOLTAGE DROOP IN A CIRCUIT USING A CURRENT CONTROLLED OSCILLATOR

(71) Applicant: Bar Ilan University, Ramat Gan (IL)

(72) Inventors: Joseph Shor, Tel Mond (IL); Amir Mizrahi, Kfar Yona (IL); Gil Golan, Ramat Gan (IL); Orel Dahaman, Ramla (IL); Omer Nechushtan, Rishon Lezion (IL)

( * ) Notice: Subject to any disclaimer, the term of this patent is extended or adjusted under 35 U.S.C. 154(b) by 98 days.

(21) Appl. No.: 18/362,532

(22) Filed: Jul. 31, 2023

(65) Prior Publication Data

US 2024/0053386 A1 Feb. 15, 2024

Related U.S. Application Data

(60) Provisional application No. 63/371,388, filed on Aug. 14, 2022.

(51) Int. Cl.
*G01R 19/25* (2006.01)
*G01R 15/16* (2006.01)

(52) U.S. Cl.
CPC ............ *G01R 19/25* (2013.01); *G01R 15/16* (2013.01)

(58) Field of Classification Search
CPC ....................... G01R 31/3004; G01R 19/0092; G01R 29/26; G01R 31/275; G01R 31/50; G01R 19/16528; G01R 19/25; G01R 25/005; G01R 31/318566; G01R 19/12; G01R 15/144; G01R 31/3163; G01R 31/31709; G01R 31/31727; G01R 31/31835; G01R 19/0038; G01R 31/31708; G01R 31/31726; G01R 31/36; H03L 7/091; H03L 7/099; H03L 2207/06; H03L 7/0812; H03L 7/0995; H03L 7/0991; H03L 7/0997; H03L 7/0996; H03L 7/141; G06F 1/3206; G06F 1/08; G06F 1/206; G06F 11/3409; G06F 30/343; G06F 11/26; G06F 11/30; G06F 11/3452
See application file for complete search history.

(56) References Cited

U.S. PATENT DOCUMENTS

| | | | | | |
|---|---|---|---|---|---|
| 4,226,245 | A * | 10/1980 | Bennett, Jr. | A61N 1/3708 | 607/27 |
| 6,005,444 | A * | 12/1999 | Carpelan | H03L 7/099 | 331/34 |
| 7,570,181 | B2 * | 8/2009 | Krishnan | H03M 1/0607 | 341/118 |
| 8,933,737 | B1 * | 1/2015 | Chatterjee | H03L 7/095 | 327/158 |
| 10,423,182 | B2 * | 9/2019 | Mosalikanti | G01R 19/16552 | |
| 10,752,202 | B2 * | 8/2020 | Wang | B60R 22/023 | |
| 10,928,886 | B2 * | 2/2021 | Mosalikanti | H03L 7/095 | |
| 11,442,082 | B2 * | 9/2022 | Felix | G06F 1/10 | |

* cited by examiner

*Primary Examiner* — Vinh P Nguyen
(74) *Attorney, Agent, or Firm* — Daniel J. Swirsky; AlphaPatent Associates Ltd.

(57) ABSTRACT

A method for measuring voltage droop and temperature in a circuit include using capacitive coupling to couple a bias voltage of a current controlled oscillator (CCO) to a noisy digital Vcc (VCCD) supply, so that a frequency of the CCO is independent of a DC Vcc level of the noisy VCCD supply and the CCO measures an AC voltage droop of the noisy VCCD supply and a temperature which is dependent upon the AC voltage droop.

9 Claims, 16 Drawing Sheets

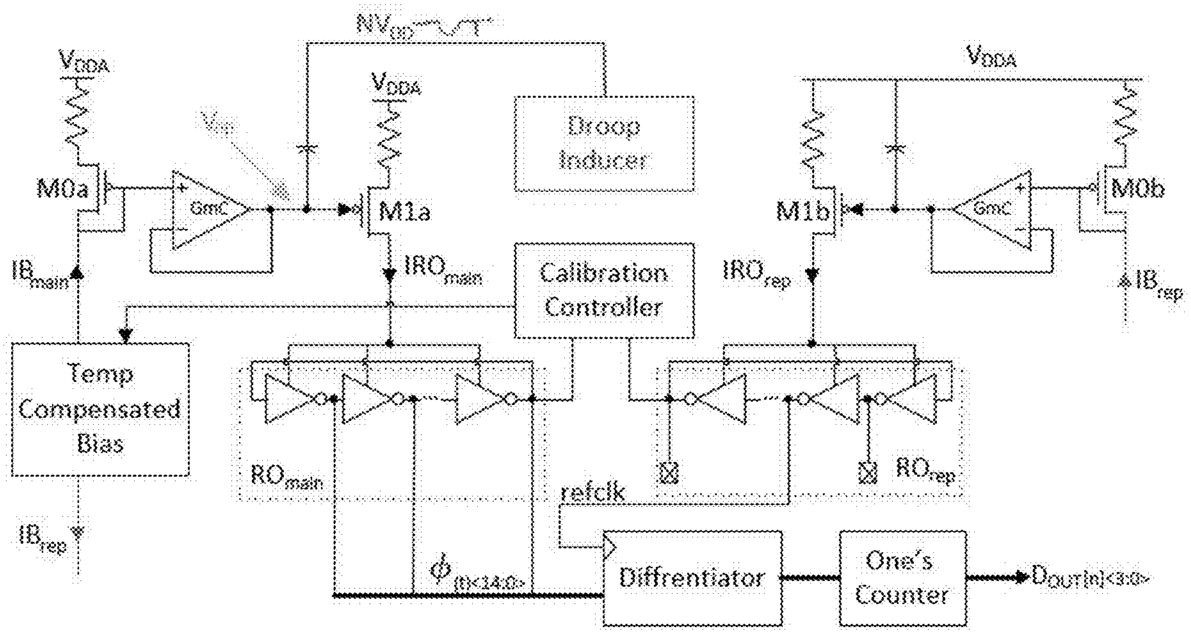
FIG. 2
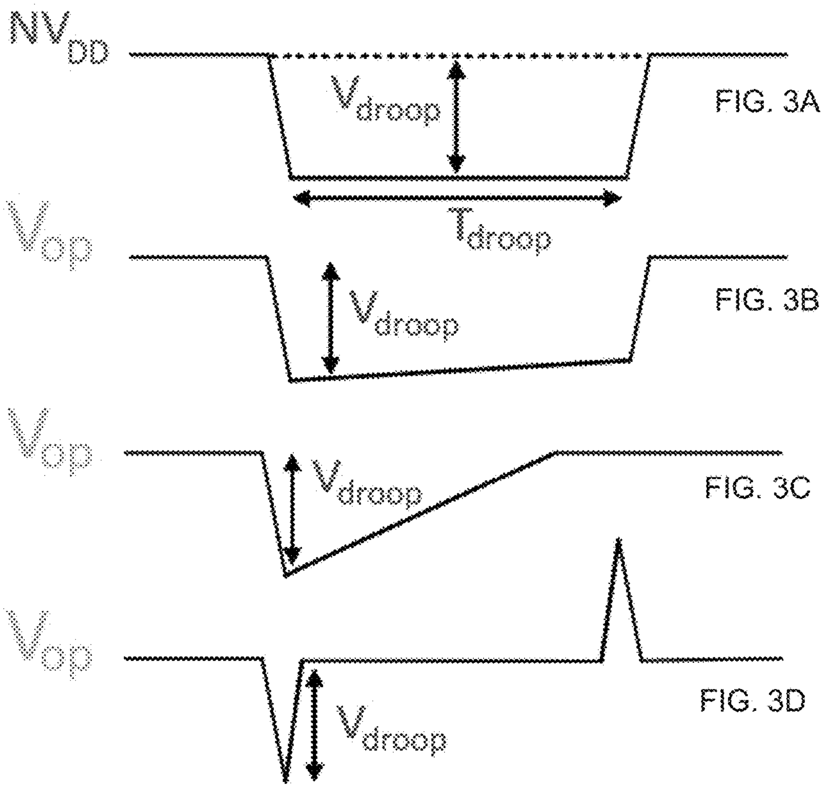
FIG. 3A
FIG. 3B
FIG. 3C
FIG. 3D

| | JSSC'22 | JSSC'20 | ISSCC'18 | ISSCC'17 | ISSCC'17 | JSSC'16 | JSSC'04 | This Work |
|---|---|---|---|---|---|---|---|---|
| Process | 65nm | 10nm | 14nm | 14nm | 22nm | 16nm | 90nm | 28nm |
| Architecture | Offset Comparators | Delay Measurement | Delay Measurement | Flash A/D | Delay Measurement | Delay Measurement | Calibrated Comparator | Phase Comparison |
| Power [uW] | 22(AVdd=1.0V)<br>62(AVdd=1.2V) | 1480 | -- | -- | -- | 2500 | -- | 2360(AVdd)<br>1320(Dig. Vdd) |
| Area [um²] | 8,500 | -- | 12,000 | 12,875 | -- | 2,590 | -- | 41,400 |
| Detector Supply Voltage [V] | 1-1.4 | 0.6-1 | -- | 1.5 | 0.7 | 0.6-0.9 | 0.7-1.3 | 1.4 |
| Digital Supply Voltage [V] | 0.8-1.2 | 0.6-1 | -- | | 0.7 | 0.6-0.9 | 1 | 1 |
| Detectable Droop Magnitude [% Dig. Vdd] | 2.6%-16.6% | 0%-30% | -- | -- | -- | 10% | 27% | 0.5%-7.5% |
| Response Time | 3.5ns(Avdd=1.0V)<br>2ns(Avdd=1.2V) | 2ns | -- | 2.3ns | -- | 2.4ns | -- | 1.33ns |
| Accuracy | ±0.9%<br>(Dig. Vdd ≥ 0.8V) | ±2.9% | ±1% | ±1%<br>(Simulated) | -- | -- | -- | ±0.5%<br>(Simulated) |

FIG. 7A

| Reference | This work | [2] | [3] | [4] | [5] | [11] |
|---|---|---|---|---|---|---|
| Technology (nm) | 65 | 22 | 10 | 14 | 28 | 16 |
| Architecture | CCO | Delay | Delay | Delay | VCO | delay |
| Power (uW) | 297 | - | 1480 | - | 416 | 2500 |
| Area (um$^2$) | 8800* | - | - | 12000 | 108500 | 2590 |
| Area (F$^2$) | 2.1M | - | - | 61M | 138M | 10M |
| Detector Vdd Range (V) | 1.3-1.7 (VCCA) | 0.7 | 0.6-1 | - | 0.7-1.1 | 0.6-0.9 |
| Digital Vdd Range | 0.8-1.2 | 0.7 | 0.6-1 | - | 0.7-1.1 | 0.6-0.9 |
| Accuracy (mV) | 10 | - | 29 | 10 | 5.3 | - |
| Temperature Dependent ? | compensated | yes | yes | yes | yes | yes |
| DC Vcc dependent ? | no | yes | yes | yes | yes | - |

* Area/power include the temperature sensor.

FIG. 18 - TABLE A

Temperature Sensor Comparison

| Reference | This work | [6] | [7] | [8] |
|---|---|---|---|---|
| Technology (nm) | 65 | 65 | 16 | 40 |
| Architecture | CCO | CCO | Bulk Diode | TD |
| Power (uW) | 15 | 93.6 | 18.0 | 2625 |
| Area (um$^2$) | 1523* | 1850 | 2500 | 1650 |
| Area (F$^2$) | 0.36M | 0.44M | 9.8M | 1M |
| p-p Inaccuracy ($^{\circ}$C) | ± 3 | ± 2 | ± 1.75 | ± 1.4 |
| Temp Range ($^{\circ}$C) | 5 to 110 | -10 to 110 | -15 to 110 | -40 to 125 |
| Relative Inaccuracy % ** | 5.7 | 3.3 | 2.8 | 1.7 |
| Resolution ($^{\circ}$C) | 0.79 | 0.32 | 0.3 | 0.36 |
| Conversion Time (us) | 1.6 | 20 | 13 | 1000 |
| Calibration points | 2 | 2 | 0 | 0 |
| Suppy Sensitivity ($^{\circ}$C/100mV) | 0.5 | 0.24 | 0.15 | - |

*The area and power of the temperature sensor include the PTAT circuit and counter

** Relative Inaccuracy define as pp inacurracy*range/100 [16]

FIG. 19 - TABLE B

METHOD FOR MEASURING VOLTAGE DROOP IN A CIRCUIT USING A CURRENT CONTROLLED OSCILLATOR

FIELD OF THE INVENTION

The present invention relates generally to circuitry for detecting voltage droops and particularly to a current controlled voltage droop and temperature detector.

BACKGROUND OF THE INVENTION

The Vdd supply of integrated circuits (ICs) determines both the power consumption and performance of the chips, and is thus a crucial parameter. To minimize ripple, decoupling capacitors are placed on the board, package and die, such that a robust power delivery is available across a large frequency range. Despite these capacitors, there are parasitic inductances across the power delivery network (PDN), which lead to resonances at various frequencies, with the most disruptive ones usually between 0.5 and 100 MHz. When there is a large current surge on the chip, it may activate one of these resonances, resulting in a significant voltage droop, which can be ~10% of the Vcc level. Timing errors may be caused because of the droops, which would cause errors in the synchronous speed-paths in the digital logic. When this happens, miscalculations in the mathematical digital calculations could occur, leading to bugs in the computations.

One possibility to mitigate these timing errors is to add guardband (GB) to Vcc, such that even during a droop, the Vcc level has enough margin to withstand the timing constraints. However, this GB costs significant additional power, since power increases as $Vdd^2$ and therefore also increases as $GB^2$. To optimize the power consumption, there have been significant efforts to detect and mitigate these droops, to reduce the GB.

There are several methods to detect a droop. Analog droop detectors use analog circuits, such as comparators, to determine when the Vcc crosses a predefined reference. For example, a voltage reference and four parallel comparators may be used in a flash-like configuration. The analog detectors require a precision reference, and each detection level needs its own comparator. The detection speed is dependent on the power consumption of this comparator.

In principle, the transition speed of a digital logic gate can be very fast compared to an analog comparator for a given power. Digital detectors have been reported which utilize either delay lines configured as critical path monitors (CPM), or voltage-controlled ring oscillators (VCO) to measure droops. The digital droop detectors can be simpler to design, synthesizable, and could potentially provide a high-resolution signal across a wide voltage range. Once a droop is detected, several options have been suggested to mitigate it, including architectural instruction throttling, adaptive frequency throttling and charge injection.

A prior-art CPM (also known as TRC, that is, tunable replica circuit) is shown in FIG. 1 (M. Cho et al., "Postsilicon Voltage Guard-Band Reduction in a 22 nm Graphics Execution Core Using Adaptive Voltage Scaling and Dynamic Power Gating," in *IEEE Journal of Solid State Circuits*, vol. 52, no. 1, pp. 50-63, January 2017). Several delay paths are available, which can be an inverter, NOR, NAND or RC type. The delay can be tuned and measured with a time-to-digital converter (TDC). This circuit has been suggested as a process monitor, but can also be applied toward measuring droops, since the delay is highly dependent on the droop level. VCO's have also been proposed as droop detectors and in that case, they could be configured either to measure the frequency or the phase, like a TDC.

However, a major problem with these digital detectors is that they are highly sensitive to several other parameters besides the AC droop, including the Vcc DC level and temperature of the gates. All these parameter dependencies are also very highly inter-dependent on each other. For example, the AC droop's dependency on DC Vcc level will change at different temperatures, and its temperature dependence will vary at different DC Vcc values. To accurately measure the droops based on these parameters, a 3D matrix of these dependencies is required, which is quite cumbersome. This difficulty severely limits their utility in real-time applications

SUMMARY

The present invention seeks to provide a current controlled voltage droop and temperature detector, as described in detail below.

As mentioned above, prior-art droop detectors utilize digital delay circuits, such as tunable replica circuits to measure voltage droops. However, the delay is a strong function of temperature as well as the DC Vcc level, making it difficult to differentiate the AC droop across different voltage and temperature levels. The present invention utilizes a current controlled oscillator (CCO) with an analog bias to mitigate the voltage and temperature dependencies, such that only the AC droop is measured. The CCO frequency is independent of the DC Vcc level, while the temperature is also characterized along with the AC droop, such that both temperature and droop levels can be extracted. The sensor can measure droops and temperature to an accuracy of 10 mV and ±3° C. respectively. In one non-limiting embodiment, the circuit occupies 8800 $\mu m^2$ in 65 nm with a power consumption of 297 μW. This circuit is very useful to characterize the power grid in design for test (DFT) applications as well as on-the-fly real time chip operation The current-controlled oscillator (CCO) is utilized to simultaneously detect AC droop events and temperature. The noisy digital Vcc (VCCD) supply is capacitively coupled to the CCO to eliminate the DC Vcc dependency, while the temperature dependence can be simultaneously measured with the droop and calibrated.

BRIEF DESCRIPTION OF DRAWINGS

The present invention will be understood and appreciated more fully from the following detailed description, taken in conjunction with the drawings in which:

FIG. 2 is a simplified circuit schematic of the voltage droop detector system, in accordance with a non-limiting embodiment of the invention.

FIGS. 3A-3D are graphical illustrations of the effect of different values of τ on the droop response, wherein in FIG. 3A, the current source gate voltage is depicted for a τ significantly longer than the duration of the droop period ($T_{droop}$); FIG. 3B shows the case where τ is long but still insufficient, resulting in sustained droop with a gradual return to $V_{re}f$; FIG. 3C shows the scenario where τ is smaller than $T_{droop}$, causing the voltage to return to $V_{ref}$ before the droop entirely dissipates; and FIG. 3D displays the behavior of the current source gate with no resistance, allowing only the transition through the capacitor.

FIG. 7A is a table which compares features of the droop detector in accordance with the above-described embodiment of the invention with 7 prior art detectors.

FIG. 18 (Table A) and FIG. 19 (Table B) are tables that respectively compare the droop detector, RO1, and the thermal sensor, RO2, to published works.

DETAILED DESCRIPTION

Figure 1:
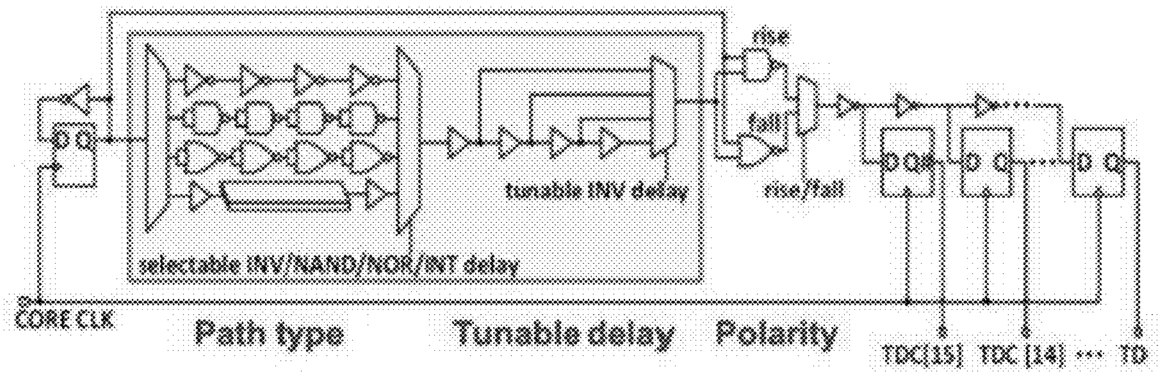
FIG. 1 PRIOR ART
FIG. 1 is a prior art critical path monitor or tunable replica circuit.
Figure 1A:
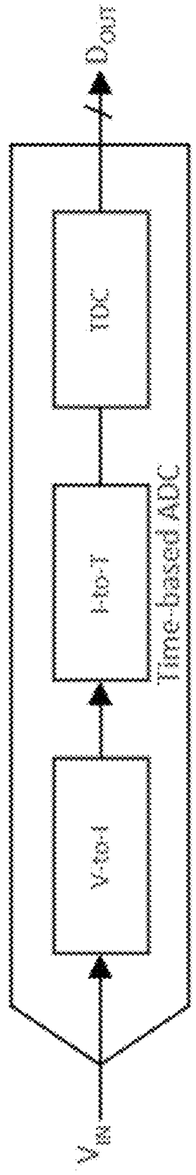
FIG. 1A is a simplified block diagram of a multi-stage conversion process for transforming supply noise into digital bits, in accordance with a non-limiting embodiment of the invention.

Reference is now made to FIG. 1A, which is a simplified block diagram of a multi-stage conversion process for transforming supply noise into digital bits, in accordance with a non-limiting embodiment of the invention.

In the first stage, the conversion begins by translating voltage fluctuations into current variations. Subsequently, the converted current is transformed into time fluctuations in the second stage. Lastly, the temporal variations are converted into digital format in the final stage.

Figure 1B:
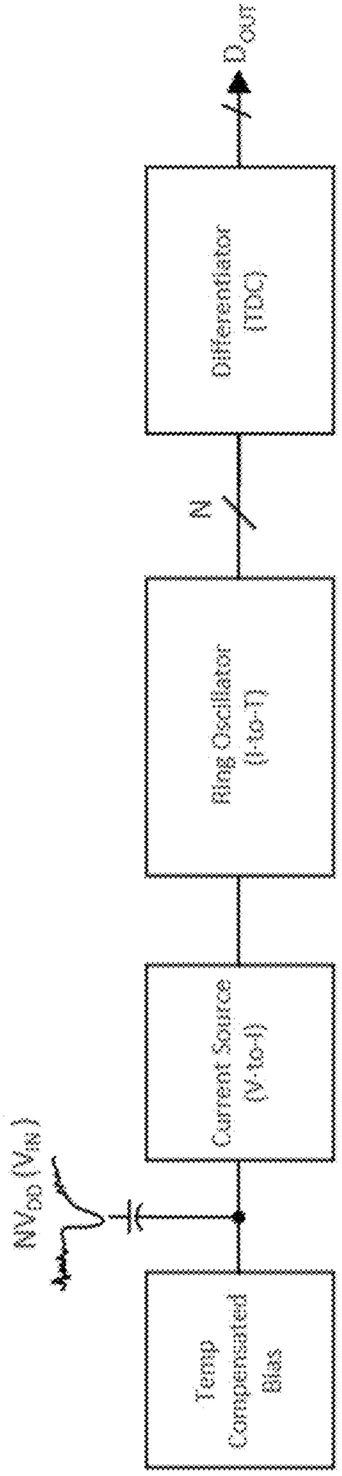
FIG. 1B is a simplified block diagram of a voltage droop detector system, in accordance with a non-limiting embodiment of the invention.

Reference is now made to FIG. 1B, which illustrates a block diagram of the voltage droop detector system. This system is designed to be AC coupled to the input voltage VDDN, representing a noisy or droop-prone supply. A controlled current source facilitates the initial voltage-to-current conversion process at the system's input. The resulting current drives a ring oscillator, effectively controlling its frequency. Hence, the overall configuration is a current-controlled oscillator (CCO), representing the second conversion stage. Finally, the N phase output of the CCO is sampled through a differentiator, generating an N-bit digital thermometric code corresponding to the supply droop's magnitude and presence. This stage serves as the final conversion in the process.

Reference is now made to FIG. 2, which illustrates circuitry of the system, in accordance with a non-limiting embodiment of the invention. Initially, a biased system generates a temperature-compensated current mirrored from PMOS transistors M0*a* and M0*b* to PMOS transistors M1*a* and M1*b*, respectively, via a Gmc (transconductor-capacitor) filter. The rationale behind incorporating a Gmc filter is discussed below. The noise or pulse originating from the noisy supply is coupled through capacitance, modulating the current supplied to the main ring oscillator ($RO_{main}$) and altering its frequency. Conversely, the replica ring oscillator RO rep is connected to a stable supply, ensuring that the frequency of the RO rep remains constant. The differentiator module converts the frequency variation into a thermometric code, subsequently processed by a one's counter to yield a digital code. Below is presented a comprehensive explanation of this conversion process.

The CCO has a PTAT (proportional to absolute temperature) nature—as the temperature rises the frequency increases, since Vth of the transistors drops. To get a constant dF/dV, one requires a highly CTAT (conversely proportional to absolute temperature) bias. This bias is calibrated such that the dF/dV of the oscillator is temperature independent.

The droop is injected into the main current source of the ring oscillator (RO) through the AC capacitor of the filter. The selection of the filter's time constant (τ=RC) plays a critical role in ensuring the system's proper functioning. FIGS. 3A-3D illustrate the effect of different values of τ on the droop response. In FIG. 3A, the current source gate voltage is depicted for a τ significantly longer than the duration of the droop period ($T_{droop}$). Subsequently, FIGS. 3B, 3C, and 3D illustrate the impact of various τ values on the filter behavior. FIG. 3B shows the case where τ is long but still insufficient, resulting in sustained droop with a gradual return to $V_{re}f$. Conversely, FIG. 3C shows the scenario where τ is smaller than $T_{droop}$, causing the voltage to return to $V_{ref}$ before the droop entirely dissipates. Lastly, FIG. 3D displays the behavior of the current source gate with no resistance, allowing only the transition through the capacitor. In order to achieve a sufficiently long τ, the low-pass filter (LPF) necessitates a large resistor and capacitor. However, the resistor has been replaced with a GMC amplifier connected in a buffer configuration with minimal bandwidth to save space. The bandwidth of the amplifier is mathematically described by the following equation:

$$f_{bw} = \frac{G_M}{2\pi C_{droop}}$$

Figure 4:
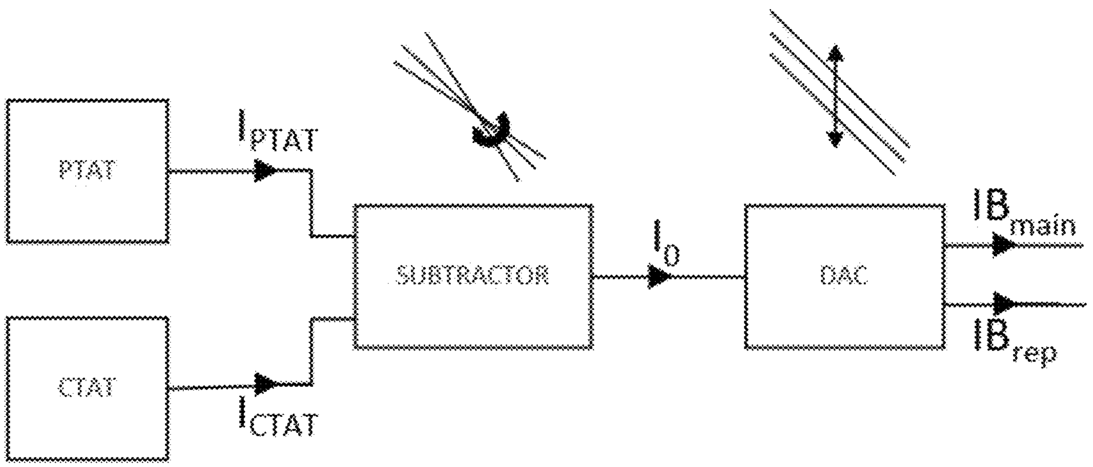
FIG. 4 is a simplified block diagram of a bias system designed to mitigate temperature dependency, in accordance with a non-limiting embodiment of the invention, including a PTAT current source, a CTAT current source, substructure, and a digital to analog convertor.

Reference is now made to FIG. 4. The bias system is designed to mitigate temperature dependency. It consists of four key components: the Proportional-to-Absolute-Temperature (PTAT) current source, the Complementary-to-Absolute-Temperature (CTAT) current source, the substructure, and the current DAC. The subtractor module performs the subtraction of the PTAT current from the CTAT current, effectively regulating the temperature coefficient of the resulting current. Subsequently, the current $I_0$ is directed to a binary DAC, which governs the magnitude of the current supplied to the current minors of the main and replica ring oscillators (ROs).

Figure 5:
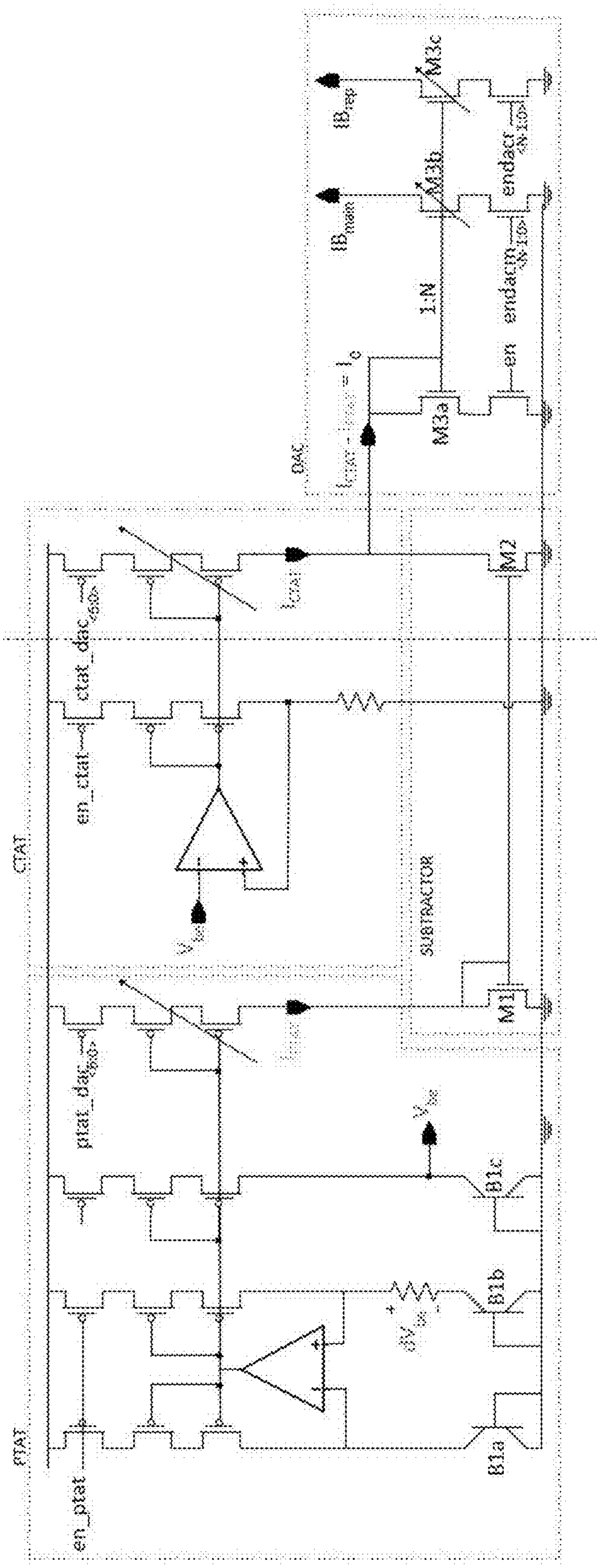
FIG. 5 is a circuit schematic of the bias system, in accordance with a non-limiting embodiment of the invention.

Reference is now made to FIG. 5. The PTAT current is generated by applying dV_BE across a resistor. This voltage variation, dV_BE, is achieved by appropriately sizing BJT (bipolar junction) transistors B1*a* and B1*b*. Within the amplifier loop configuration, the voltage across the resistor corresponds to the V_BE of B1*a*-VBE of B1*b*, generating the PTAT current. This PTAT current is mirrored using a current digital-to-analog converter (DAC) and directed to the subtractor stage.

Transistor B1*c*, operating as a BJT, is selected with a specific size to achieve the desired voltage across the CTAT resistor. The VBE voltage is a CTAT voltage that undergoes loop application across a resistor, generating the CTAT current. The CTAT current is mirrored using a current DAC and directed to the subtractor stage.

The subtractor stage comprises NMOS transistors M1 and M2, with M1 mirroring the PTAT current to M2, while the CTAT current is injected into the drain of M2. As a result, the output current of the subtractor stage is determined by the difference between the CTAT and PTAT currents, yielding the CTAT-PTAT current. This arrangement enables the bias system to regulate the temperature coefficient of the current. This resultant current serves as the input to a binary DAC, which controls the magnitude of the current supplied to both the main and replica ROs.

The differentiator module is constructed using two cascaded D Flip-Flops (DFFs) and an XOR gate synchronized with the same reference clock. In this configuration, the first DFF quantizes and compares the main RO phases with the previous quantized phase sample at the XOR gate. The XOR gate produces an output when $\phi_i$[n] is not equal to $\phi_i$[n−1] for i∈0,1, . . . ,14. By applying the Z-transform to the differentiator output signal, we obtain the following expression:

$$Z\{|\phi_i[n] - \phi_i[n-1]|\} = \Phi_i(Z) - \Phi_i(Z)Z^{-1} = \Phi_i(Z)\left(1 - Z^{-1}\right)$$

Here, the input signal is represented as $\Phi_i$(Z). Further analysis of the discrete differentiator transfer function yields:

$$\text{Differentiator}_{TF}(Z) = \frac{\left|\Phi_i(Z)\left(1 - Z^{-1}\right)\right|}{\Phi_i(Z)} = \left|1 - Z^{-1}\right|$$

The differentiator samples the 15 phases of the main RO using a reference clock derived from the replica. The resulting discrete-time differentiator transfer function behaves as a high-pass filter.

Figure 6:
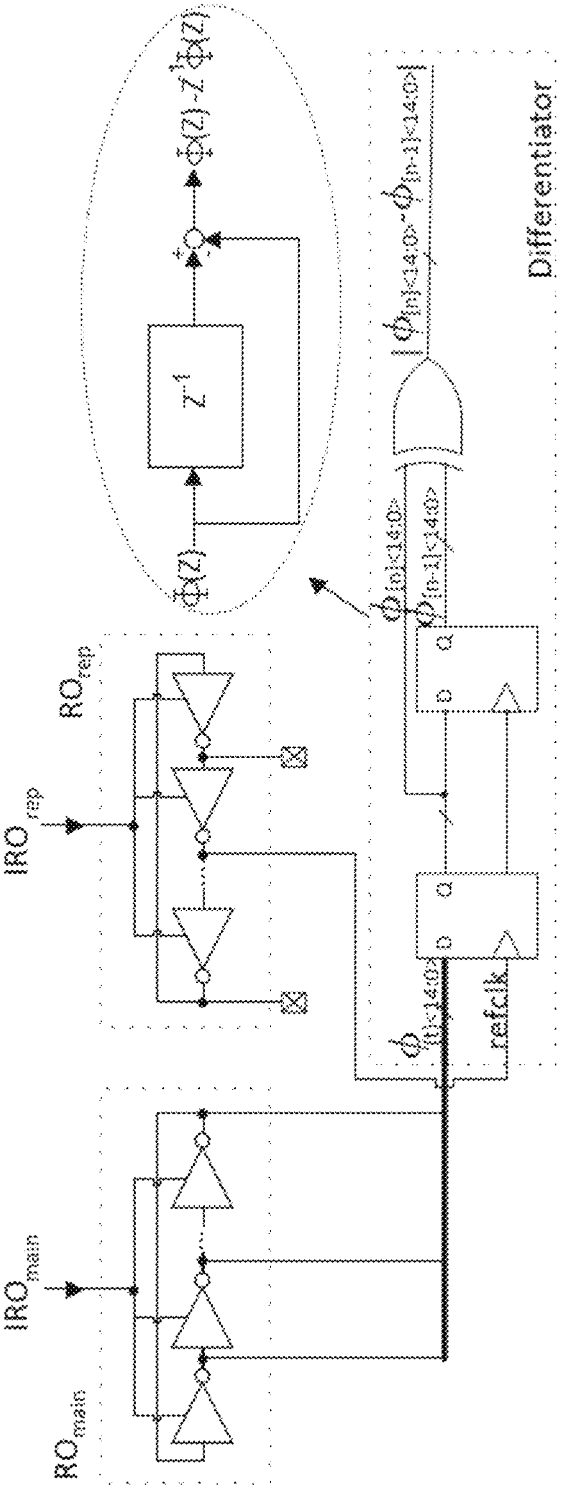
FIG. 6 is a simplified Z-domain block diagram of the differentiator, in accordance with a non-limiting embodiment of the invention.

FIG. 6 illustrates the simplified Z-domain block diagram of the differentiator. It is important to note that the quantization noise and the desired signal follow distinct transfer functions at the output. The quantization noise, originating from the initial DFF output, encounters the differentiator transfer function described by the above differentiator transfer function equation, and subsequently passes through the high-pass filter stage. Meanwhile, the signal progresses through the ring oscillator, which undergoes a VCO transfer function, acting as an integrator and effectively operating as a low-pass filter. This characteristic of the system allows for noise shaping.

The main and replica phases of the ring oscillator (RO) necessitate the inclusion of buffering and level-shifting components due to the differentiator's operation within the digital domain and the need to mitigate sampling noise. The buffer tree receives inputs from the 15 data phases of the main RO and the selected reference phase from the replica RO. It is important to note that during droop, the analog level of the main RO phases is directly proportional to the magnitude of the supply droop, denoted as $\phi$data∝Vdroop. Conversely, the sampling phase from the replica RO maintains a constant analog level identical to the main RO phase without any supply droop occurrence.

The sampling phase must be delivered simultaneously to ensure synchronized arrival at all 30 differentiator D-type flip-flops (DFFs). The data phases must also exhibit the same delay up to the differentiator. The buffer tree uses weighted versions of minimum-sized process inverters, allowing each data clock pair to reach the differentiator stage.

As only one replica RO phase is employed while all main RO phases serve as inputs to the buffer tree, a dummy load is incorporated for the replica RO. The dummy load ensures that the natural oscillation frequency of the replica RO remains identical to that of the main RO, and identical buffers positioned in the main RO serve to isolate the internal phase from the buffer tree.

Figure 7:
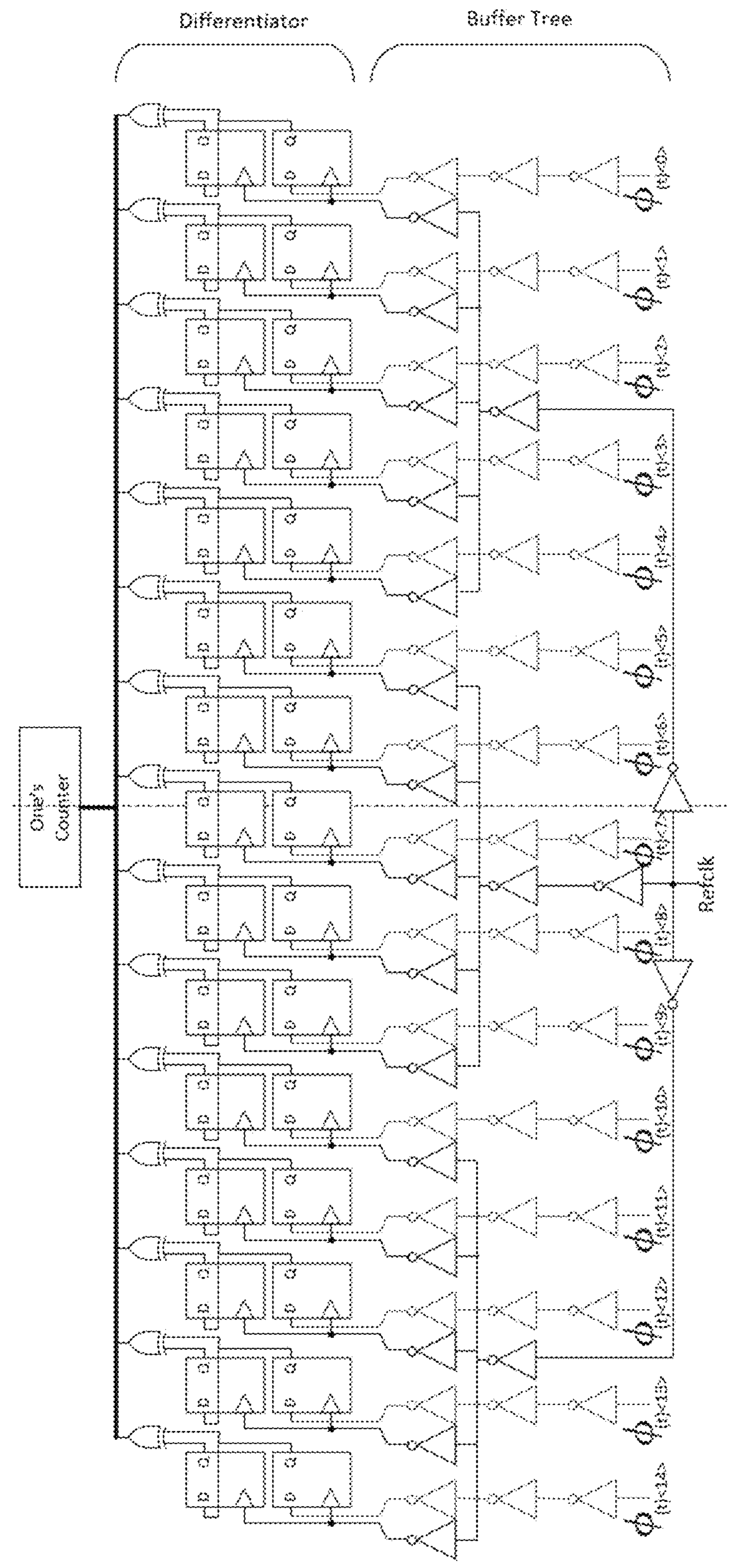
FIG. 7 is a simplified circuit schematic of the sampling clock buffer tree, in accordance with a non-limiting embodiment of the invention.

The initial step involves constructing the sampling clock buffer tree to meet the timing requirements, with a single sampling phase driving the clock ports of all 30 DFFs. This sampling clock buffer tree consists of four buffering stages originating from the RO output. Initially, it drives three inverters that divide the sampling phase into three distributed clocks, which drive strength buffers and are further split, as shown in FIG. 7.

Reference is now made to the table in FIG. 7A which compares features of the droop detector in accordance with the above-described embodiment of the invention with 7 prior art detectors taken from different articles in JSSC (IEEE Journal of Solid-State Circuits). While this table demonstrates a higher power consumption and larger area size for this droop detector implementation, it introduces a novel architecture that offers a significantly faster response time to droop than previous approaches. The achievement of a temperature-independent system justifies the utilization of additional power and area resources. The response time, currently set at 2 Tref cycles, can be further reduced and relies heavily on advanced and scaled-down process technologies. As the gate capacitance (Cg) decreases with these advancements, the ring oscillator can achieve higher oscillation frequencies while maintaining the same power consumption level.

It should be noted that the temperature controlled bias causes the dF/dV of the droop detector to be temperature independent. However, the base frequency of ROmain and ROref can still have either a PTAT or CTAT temperature dependence. Thus, these frequencies can be measured by a counter to yield an accurate temperature reading, and hence this circuit could also function as a temperature sensor. This can be done by either measuring the ROrep frequency or the ROmain. In the case of ROmain, the frequency should be measured over many cycles so that the perturbations caused by the droops could be negligible.

Architecture and Circuit Design of an Alternative Embodiment

Figure 8:
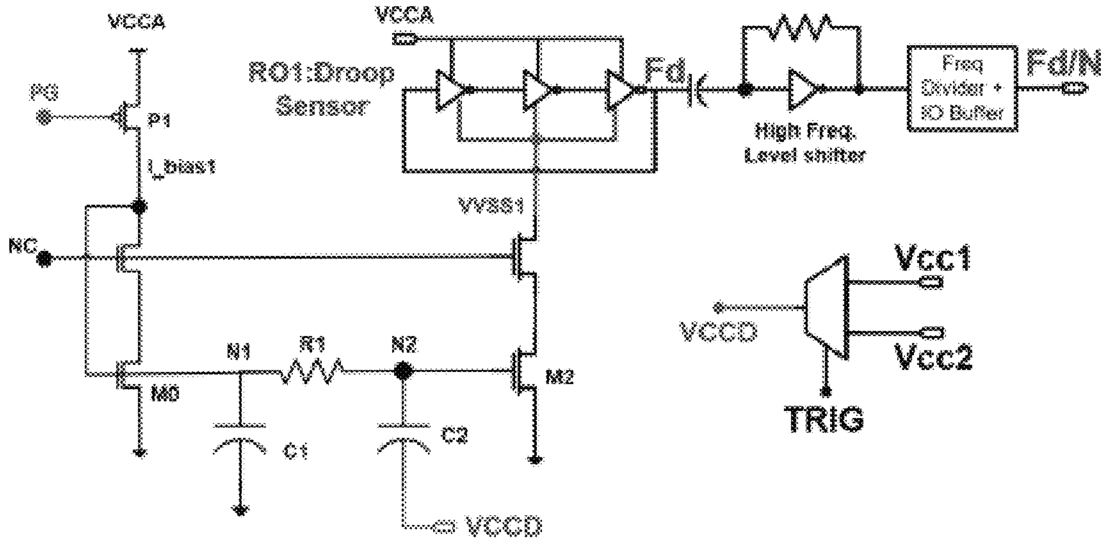
FIG. 8 is a simplified circuit schematic of a voltage droop detector system, in accordance with another non-limiting embodiment of the invention.
Figure 9A:
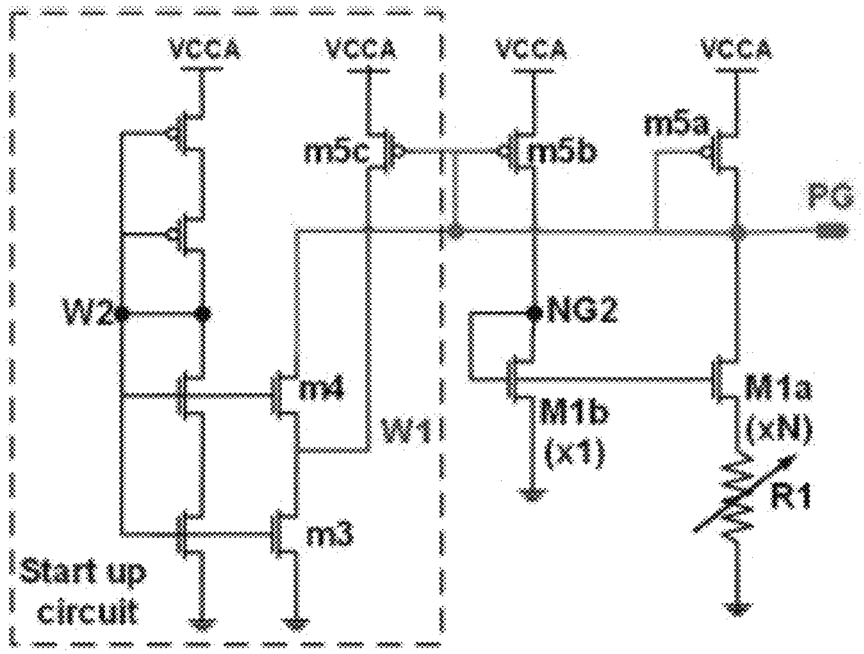
FIG. 9A is a simplified circuit schematic of a PTAT circuit which generates the bias voltage, in accordance with a non-limiting embodiment of the invention

A simplified circuit schematic of a droop/temperature detector in accordance with another embodiment of the invention is shown in FIG. 8. The PMOS, P1 provides a proportional to absolute temperature (PTAT) analog current bias, I_bias1, to the sensor. The PTAT circuit which generates the bias voltage, PG, is shown in FIG. 9A. The current, I_bias1 is mirrored to NMOS M2, which provides current to the Vss connection (vvss1) of RO1, which is a CCO. The noisy digital supply, VCCD is capacitively coupled to N2, and will alter the current in M2, which will then change the frequency, Fd, of RO1.

The frequency change with droop voltage (dF/dV) can be characterized by the following equation:

$$\frac{dF}{dV} = \frac{dF}{dI} * \frac{dI}{dV} = \frac{gm_2}{C_{ro} V_{pp}} \tag{1}$$

where $C_{ro}$ is the capacitance in RO1, $gm_2$ is the transconductance of M2, and $V_{pp}$ is the amplitude of the oscillation. At high Vgs levels, gm is nearly constant with voltage, since M2 approaches velocity saturation. The enables dF/dV to be a relatively linear function. A phase of RO1 is capacitively coupled (at Fd) to a self-biased inverter, which acts as a high frequency level shifter. The frequency is divided and driven to a chip IO. A 50-ohm terminated analog output buffer was utilized to drive the 0.2-0.6 GHz level divided Fd signal off chip. In order to stabilize the DC bias to M2, an RC filter formed by R1 and C1 is placed between nodes N2 and N1. The current mirror formed by M0 and M2 is cascoded. A CCO can also exhibit a nearly linear PTAT frequency response with temperature. The nominal frequency of Fd is 3.2 GHz at room temperature and rises linearly with temperature. It is assumed that droops are unusual events in most cases, such the average Fd over time could also be used as a temperature sensor. This would be done by taking a moving average (MA) of Fd over several 10's of μs, since temperature changes very slowly.

A droop-inducer design-for-test (DFT) circuit was also used for testing and calibration. This is a MUX, triggered by the TRIG signal, which switches between two IO Vcc supplies to impose a known droop on the circuit. The TRIG signal is also sent to the chip output to act as a trigger for oscilloscope measurements of the divided frequency, Fd/N.

The PG voltage bias in FIG. 8 is produced by a constant-gm PTAT current source, shown in FIG. 9A together with its startup circuit. The current density of M1*a* is scaled down by a factor N compared to M1*b*. Assuming that M1*a* and M1*b* are biased in the subthreshold regime, the current in the circuit is described by:

$$I = \frac{nKT}{qR_1} \ln(N) \tag{2}$$

where KT/q is the thermal constant, and N is the sizing ratio between M1*a*/M1*b*. The startup circuit is required to inject a small current into the PG node. Once the PTAT circuit is fully started, the startup current is eliminated by PMOS m5c.

Figure 9B:
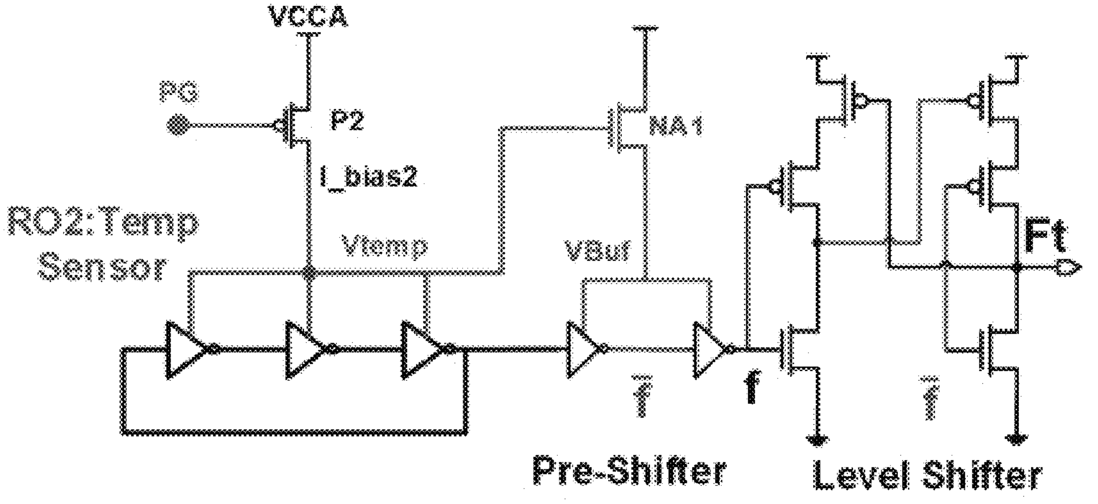
FIG. 9B is a simplified circuit schematic of another temperature sensing circuit that uses a smaller, lower-current CCO, RO2, as a temperature sensor, which provides Ft, a frequency dependent only on temperature.

Another temperature sensing option is also provided in this design by using a smaller, lower-current CCO, RO2, as a temperature sensor, which provides Ft, a frequency dependent only on temperature (FIG. 9B). This temperature sensor could be utilized in order to avoid taking a moving average of Fd, in the event that there are many droop events which would ruin a moving average. The PTAT voltage bias, PG, reused from the droop detector, is provided to P2 which charges RO2. The oscillation frequency is determined by $$F = \frac{I_{bias}}{C_{ro2} * V_{temp}} \tag{3}$$

where $I_{bias}$ and $V_{temp}$ are both temperature dependent and $C_{ro2}$ is the total capacitance of the oscillator. The resulting frequency needs to be level shifted to CMOS levels, since $V_{temp}$ is a relatively low voltage. Connecting phases of RO2 directly to a level shifter would cause the oscillator capacitance to be affected by Vcc, which would degrade the power supply rejection of the sensor. A native $V_{th}$ (threshold voltagez≈0) device, NA1, is thus used to drive a pre-shifter, such that VBuf≈$V_{temp}$ to eliminate this issue.

Measured Silicon Results

Figure 10:
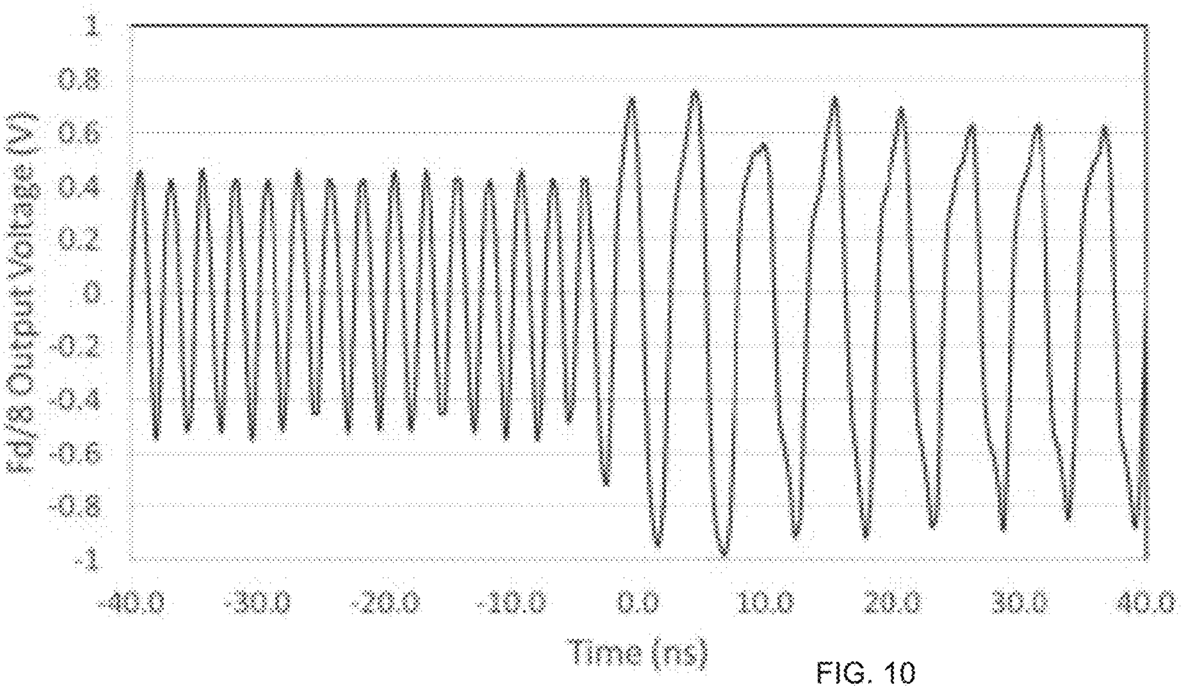
FIG. 10 is a simplified graphical illustration of raw oscilloscope measurements of Fd/8 for a 100 mV droop.
Figure 11:
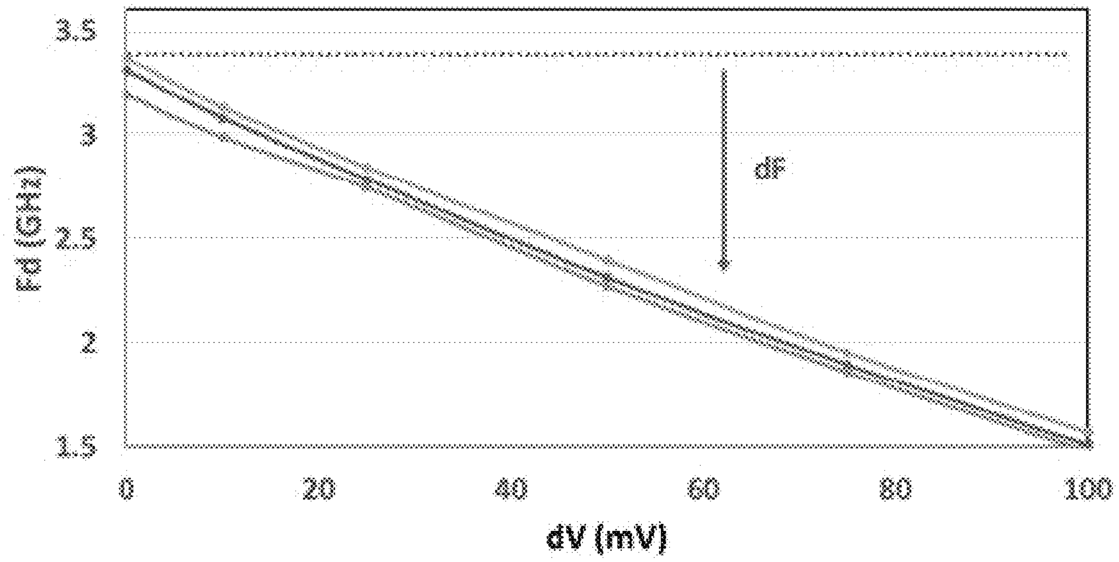
FIG. 11 is a simplified graphical illustration of changes in Fd with a dV droop.
Figure 12:
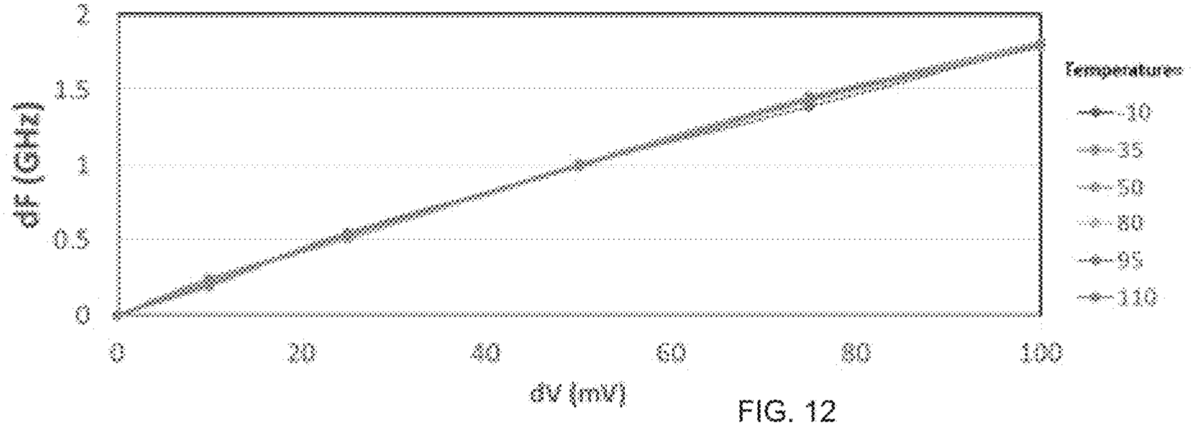
FIG. 12 is a simplified graphical illustration of the temperature dependence of dF/dV for two sensors.
Figure 13:
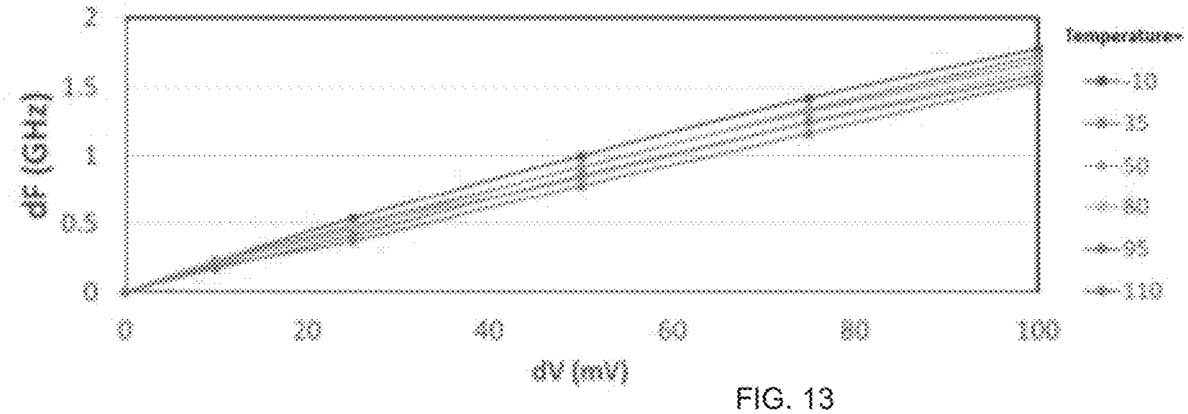
FIG. 13 is a graphical illustration showing dF vs. dV input, where dF is the change in frequency from the baseline when a droop is applied, as shown in FIG. 11 and as defined in equation (1)
Figure 13A:
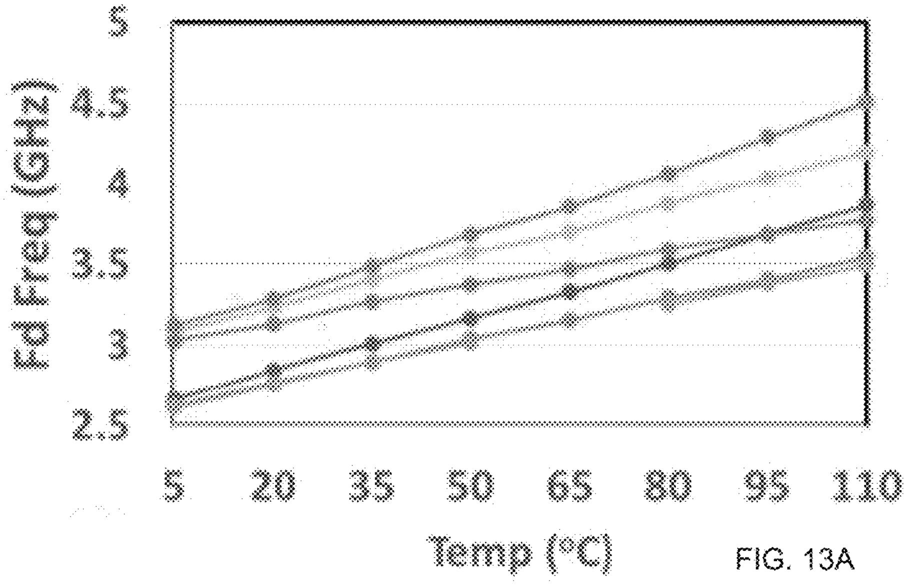
FIG. 13A is a graphical illustration of measured frequency (Fd) vs. temp of 6 droop sensors.
Figure 13B:
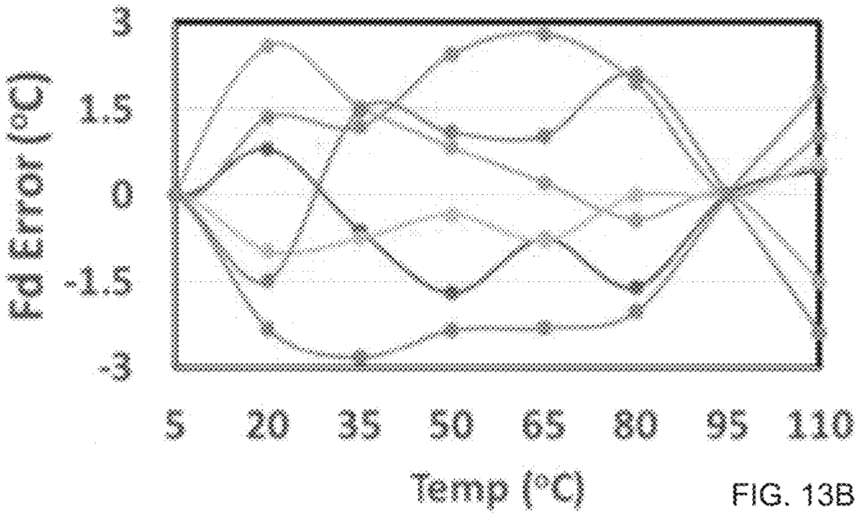
FIG. 13B is a graphical illustration of temperature error of Fd when the droop sensor is also used as a temperature sensor.
Figure 14A:
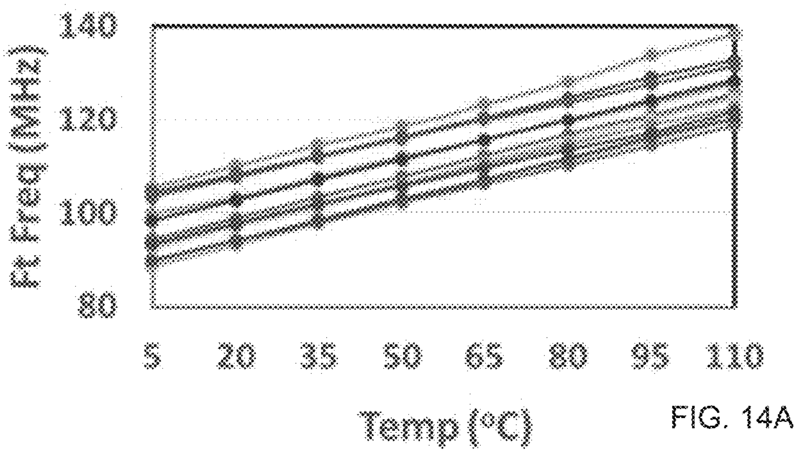
FIG. 14A is a graphical illustration of measured frequency (Ft) vs. temp for 12 temperature sensors.
Figure 14B:
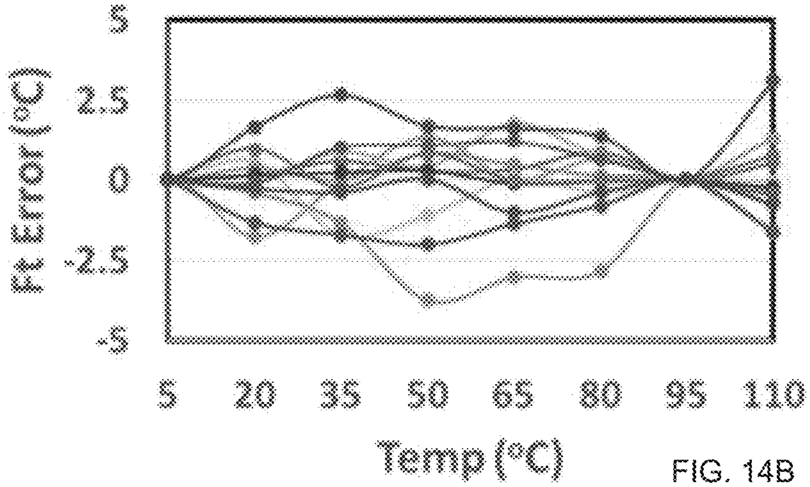
FIG. 14B is a graphical illustration of each of their respective temperature errors vs. temperature.

The droop detector was designed and fabricated in the TSMC 65 nm process. FIG. 10 shows raw oscilloscope measurements of Fd/8 for a 100 mV droop. The external TRIG signal is used to trigger the scope at time=0, but the internal trigger is ~3 ns before that. The change in Fd with a dV droop is shown in FIG. 11 for 3 sensors. It is observed that dF/dV has a nearly linear dependence at these dV levels with a slope of 18 MHz/mV. The 3 sensors have comparable values of dF/dV. The temperature dependence of dF/dV is shown in FIG. 12 for two sensors. One sensor has a negligible temperature dependence, while the 2nd sensor has a small linear temperature dependence of 1.95 MHz/(100 mV*° C.). This can be compensated for, if needed, by monitoring the temperature, which changes very slowly. The value of dF/dV could be calibrated at two temperatures with the values stored in memory. The temperature sensor could then be used to measure the temperature and extrapolate the value of dF/dV at the operating temperature.

The temperature dependences of Fd and Ft for several droop and temperature sensors are shown in FIGS. 13A-13B and FIGS. 14A-14B respectively. Both frequencies exhibit a linear dependence of the frequency on temperature. Assuming 2-point calibration, the temperature errors are bound by±3° C., which is sufficiently accurate for this application. By using the moving average (MA) of Fd, only the temperature dependence of dF need be considered, which would be a very small error. Without the MA, the temperature dependence of Fd needs to be considered in the dV sensing and the temperature inaccuracy (±3° C.) would result in a ~2.2 mV dV error.

Figure 15:
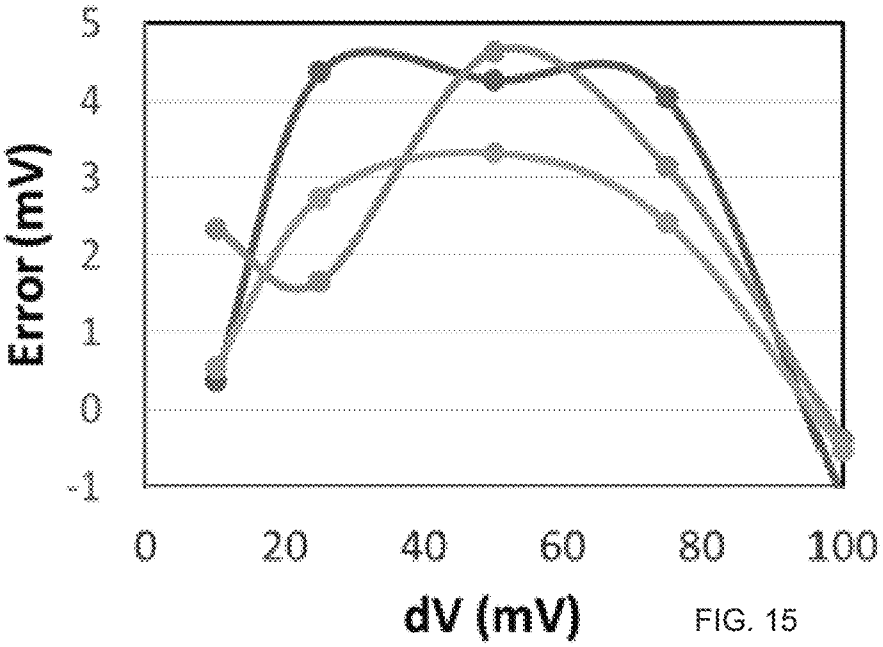
FIG. 15 is a simplified graphical illustration of the non-linearity error of dF/dV and the temperature non-linearity error vs. dV.
Figure 16:
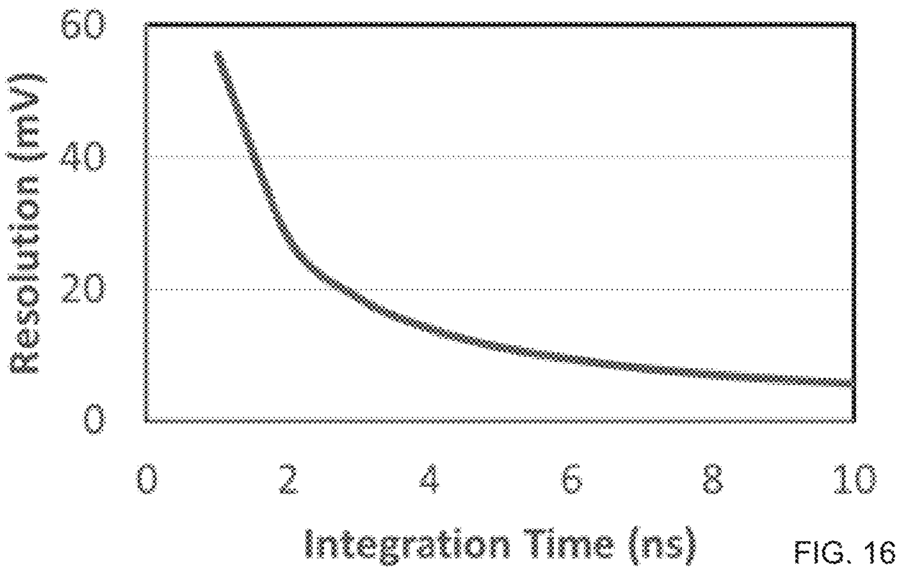
FIG. 16 is a simplified graphical illustration of the resolution vs. integration time.

The non-linearity error of dF/dV and the temperature non-linearity error vs. dV are plotted in FIG. 15. This error was calculated by using a least-square fitting of data similar to FIG. 11 and adding to that the non-linearity of dF/dT. The worst-case non-linearity is 4.8 mV. One must also consider the possible dV resolution after Ft is digitized by a counter. Considering the nominal Ft=3.2 GHz and dF/dV=18 Mhz/mV, the resolution vs. integration time is calculated in FIG.

16. The fastest droops could be measured at lower resolution, while droops in the 10's of MHz could be characterized more accurately.

The measurement speed could also be improved significantly by configuring the CCO as a TDC and measuring the Fd phase instead of frequency. Utilizing phase measurements could enable a complete measurement in one or two GHz-level frequency cycles. The purpose of this study was to demonstrate that the DC Vcc and temperature dependence of a delay circuit, such as a ring oscillator could be controlled using analog techniques. A phase-based detector may improve the detection speed and resolution significantly.

Figure 17:
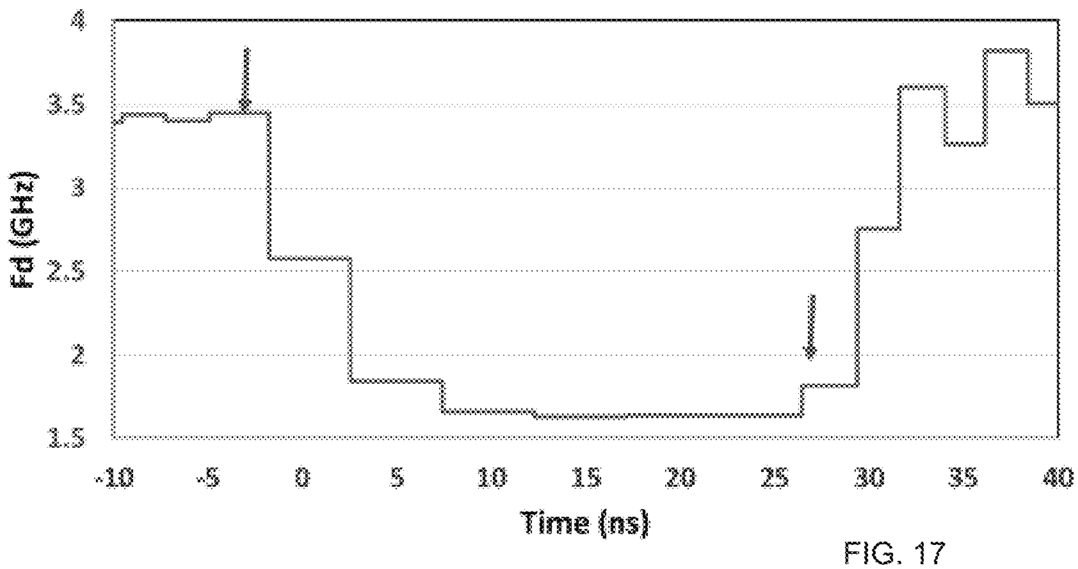
FIG. 17 is a simplified graphical illustration of a typical 100 mV droop measurement for a 30 ns VCCD pulse.

The analog portion of the circuit consumes 173 μW while a 5-bit counter at 3.5 GHz consumes 123.8 μW (simulated). A typical 100 mV droop measurement for a 30 ns VCCD pulse is shown in FIG. 17. The red arrows indicate the approximate time when the internal TRIG signal imposes the droop. The staircase nature of this graph is associated by the /8 circuit which enables Fd/8 to be driven off chip. Some supply overshoots are observed when VCCD returns to its original value. It takes ~5 ns to integrate this droop to 90% of its final value, although some of this delay is in the droop itself. Fd also exhibits an RMS jitter of 32 MHz, which would correspond to a dV jitter of 1.8 mV. The jitter is important since it determines the noise level of the Fd signal. This noise level will ultimately constrain the measurement resolution. The measurement's sensitivity to the analog supply (VCCA) is a dV error of 1 mV per 100 mV VCCA, or ~40 dB.

Conclusions

FIG. 18 (Table A) and FIG. 19 (Table B) compare the droop detector, RO1, and the thermal sensor, RO2, to published works. Prior-art detectors use timing circuits directly connected to the digital Vcc to measure droop. These sensors are highly sensitive to the Vcc DC level and temperature and require calibration of the frequency to the AC Vcc, DC Vcc, and temperature. The DC and AC Vcc dependence change at different temperatures, and these 3 parameters are very interlinked with each other. The calibration then requires a 3-dimensional look-up-table. This 3D calibration limits utility of the prior art in many applications. The present invention uses an analog controlled CCO to regulate the frequency. This makes the droop detector highly insensitive to the DC Vcc level and compensates for temperature, thus enabling a much simpler calibration. To measure the droop, the noisy supply is capacitively coupled to the gm stage of a current source, such that only the AC changes in Vcc are measured. The biasing of the gm stage is isolated from the gate using an RC filter such that the AC Vcc signal does not affect the DC bias level. In order to make the current response more linear, the gm stage is biased at relatively high Vgs, where gm does not change significantly with current. The temperature can also be measured in parallel to the droop, such that the temperature dependence of the CCO can be distinguished from the AC Vcc response. Both the AC droop and temperature are thus measured in parallel.

In accordance with an embodiment of the invention, the sensor is very small, especially when considering the technology node. The compact area would enable it to be easily placed in multiple locations on the chip. Since the droop is a spacial phenomenon in the power grid and there are multiple power domains, the ability to place many compact detectors on a chip is an important feature. A purely digital detector could potentially be even more compact. The additional analog elements of the droop detector did not constrain the area so much as to make it impractical. As a temperature sensor, this is one of the smallest sensors in the art. The temperature accuracy is not a good as some of the state-of-the-art sensors but is sufficient to calibrate the droop sensor. The resolution could be improved by utilizing a longer conversion time than done in this study (1.6 μs). This dual-functionality sensor is useful to monitor and regulate the power supply grid and temperature of a chip. These two parameters are critical for the power/performance of these devices.

Table A References:

[2] M. Cho et al., "Postsilicon Voltage Guard-Band Reduction in a 22 nm Graphics Execution Core Using Adaptive Voltage Scaling and Dynamic Power Gating," in IEEE Journal of Solid State Circuits, vol. 52, no. 1, pp. 50-63, January 2017. [3] S. Bang et al., "An All-Digital, VMAX-Compliant, Stable, and Scalable Distributed Charge Injection Scheme in 10-nm CMOS for Fast and Local Mitigation of Voltage Droop," in IEEE Journal of Solid State Circuits, vol. 55, no. 7, pp. 1898-1908, July 2020. [4] C. Vezyrtzis et al., "Droop mitigation using critical-path sensors and an on-chip distributed power supply estimation engine in the z14™ enterprise processor," in ISSCC 2018, pp. 300-302. [5] P. N. Whatmough, S. Das, Z. Hadjilambrou and D. M. Bull, "Power Integrity Analysis of a 28 nm Dual-Core ARM Cortex-A57 Cluster Using an All-Digital Power Delivery Monitor," IEEE Journal of Solid State Circuits vol. 52, no. 6, pp. 1643-1654, June 2017. K. A. Bowman et al., "A 16 nm All-Digital Auto-Calibrating Adaptive Clock Distribution for Supply Voltage Droop Tolerance Across a Wide Operating Range," in IEEE Journal of Solid-State Circuits, vol. 51, no. 1, pp. 8-17, January 2016

Table B References:

[6] A. Drake et al., "A Distributed Critical-Path Timing Monitor for a 65 nm High-Performance Microprocessor," 2007 IEEE International Solid-State Circuits Conference. Digest of Technical Papers, San Francisco, CA, 2007, pp. 398-399. [7] K. Bowman et al., "8.5 A 16 nm auto-calibrating dynamically adaptive clock distribution for maximizing supply-voltage-droop tolerance across a wide operating range," 2015 IEEE International Solid-State Circuits Conference—(ISSCC) Digest of Technical Papers, San Francisco, CA, 2015, pp. 1-3. [8] E. Alon, V. Stojanovic and M. A. Horowitz, "Circuits and techniques for high-resolution measurement of on-chip power supply noise," in IEEE Journal of Solid-State Circuits, vol. 40, no. 4, pp. 820-828, April 2005.

What is claimed is:

1. A method for measuring voltage droop in a circuit comprising:

using capacitive coupling to couple a bias voltage of a current controlled oscillator (CCO) to a noisy digital Vcc (VCCD) supply, so that a frequency of said CCO is independent of a DC Vcc level of said noisy VCCD supply and said CCO measures an AC voltage droop of said noisy VCCD supply.

2. The method according to claim 1, further comprising using said CCO to measure a temperature of a component of the circuit.

3. The method according to claim 1, wherein said CCO uses a temperature controlled bias voltage.

4. The method according to claim 2, wherein said temperature controlled bias voltage is a CTAT (conversely proportional to absolute temperature) bias calibrated such that dF/dV (frequency change with droop voltage) of said CCO is temperature independent.

5. The method according to claim 1, wherein a replica CCO is utilized to control a frequency of said CCO.

6. The method according to claim 5, wherein said CCO is sampled by said replica CCO.

7. The method according to claim 1, wherein an N phase output of said CCO is sampled through a differentiator, generating an N-bit digital thermometric code corresponding to said AC voltage droop of said noisy VCCD supply.

8. The method according to claim 1, wherein said bias voltage is generated by a temperature-compensated current mirrored from one set of transistors to another set of transistors.

9. The method according to claim 8, wherein the mirroring is done via a Gmc (transconductor-capacitor) filter, whose time constant determines a droop response of said CCO.

* * * * *